(12) United States Patent
Chang

(10) Patent No.: US 12,272,670 B2
(45) Date of Patent: Apr. 8, 2025

(54) INTEGRATED SEMICONDUCTOR PACKAGING SYSTEM WITH ENHANCED DIELECTRIC-TO-DIELECTRIC BONDING QUALITY

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 422 days.

(21) Appl. No.: 17/819,639

(22) Filed: Aug. 15, 2022

(65) Prior Publication Data
US 2024/0055389 A1    Feb. 15, 2024

(51) Int. Cl.
*H01L 21/00* (2006.01)
*H01L 21/02* (2006.01)
(Continued)

(52) U.S. Cl.
CPC ........ *H01L 24/80* (2013.01); *H01L 21/02052* (2013.01); *H01L 21/6704* (2013.01);
(Continued)

(58) Field of Classification Search
CPC ............... H01L 24/80; H01L 21/02052; H01L 21/6704; H01L 21/67173; H01L 24/08;
(Continued)

(56) References Cited

U.S. PATENT DOCUMENTS

| | | | |
|---|---|---|---|
| 2009/0142903 A1 | 6/2009 | Yu et al. | |
| 2016/0293567 A1 | 10/2016 | Liu et al. | |
| 2022/0262652 A1* | 8/2022 | Harris | ............... H01L 21/67766 |

FOREIGN PATENT DOCUMENTS

| | | |
|---|---|---|
| CN | 102598242 A | 7/2012 |
| TW | 202135358 A | 9/2021 |
| TW | 202228915 A | 8/2022 |

OTHER PUBLICATIONS

First office action received in the corresponding Taiwan application 112119150, mailed on Nov. 28, 2023.

* cited by examiner

*Primary Examiner* — Niki H Nguyen
(74) *Attorney, Agent, or Firm* — KILPATRICK TOWNSEND & STOCKTON LLP

(57) ABSTRACT

An integrated semiconductor packaging system includes: a first wet clean tool configured to perform a first wet clean process on a frame, wherein a plurality of top dies are disposed on the frame; a second wet clean tool configured to perform a second wet clean process on a wafer, wherein a plurality of bottom dies corresponding to the plurality of top dies, respectively, are disposed on the wafer; a pick-and-place tool configured to bond the plurality of top dies to the plurality of bottom dies, respectively; and a first transmission path through which the frame and the wafer are transferred from the first wet clean tool and the second wet clean tool to the pick-and-place tool, respectively, wherein the frame is directly transferred from the first wet clean tool to the pick-and-place tool, and the wafer is directly transferred from the second wet clean tool to the pick-and-place tool.

20 Claims, 6 Drawing Sheets

(51) Int. Cl.
*H01L 21/67* (2006.01)
*H01L 23/00* (2006.01)

(52) U.S. Cl.
CPC ........ *H01L 21/67173* (2013.01); *H01L 24/08* (2013.01); *H01L 24/74* (2013.01); *H01L 24/94* (2013.01); *H01L 2224/08145* (2013.01); *H01L 2224/80895* (2013.01); *H01L 2224/80896* (2013.01); *H01L 2224/94* (2013.01)

(58) Field of Classification Search
CPC ............... H01L 24/74; H01L 24/94; H01L 2224/08145; H01L 2224/80895; H01L 2224/80896; H01L 2224/94; H01L 2224/08146; H01L 21/67775; H01L 21/68
See application file for complete search history.

INTEGRATED SEMICONDUCTOR PACKAGING SYSTEM WITH ENHANCED DIELECTRIC-TO-DIELECTRIC BONDING QUALITY

FIELD

Embodiments of the present disclosure relate generally to semiconductor packaging, and more particularly to integrated semiconductor packaging system with enhanced dielectric-to-dielectric bonding quality.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various dielectric, semiconductor, and metal layers. The areas of the layer that are to be deposited or removed are controlled through photolithography. Each deposition and removal process is generally followed by cleaning as well as inspection steps. Therefore, both IDMs and foundries rely on numerous semiconductor equipment and semiconductor fabrication materials, often provided by vendors. There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
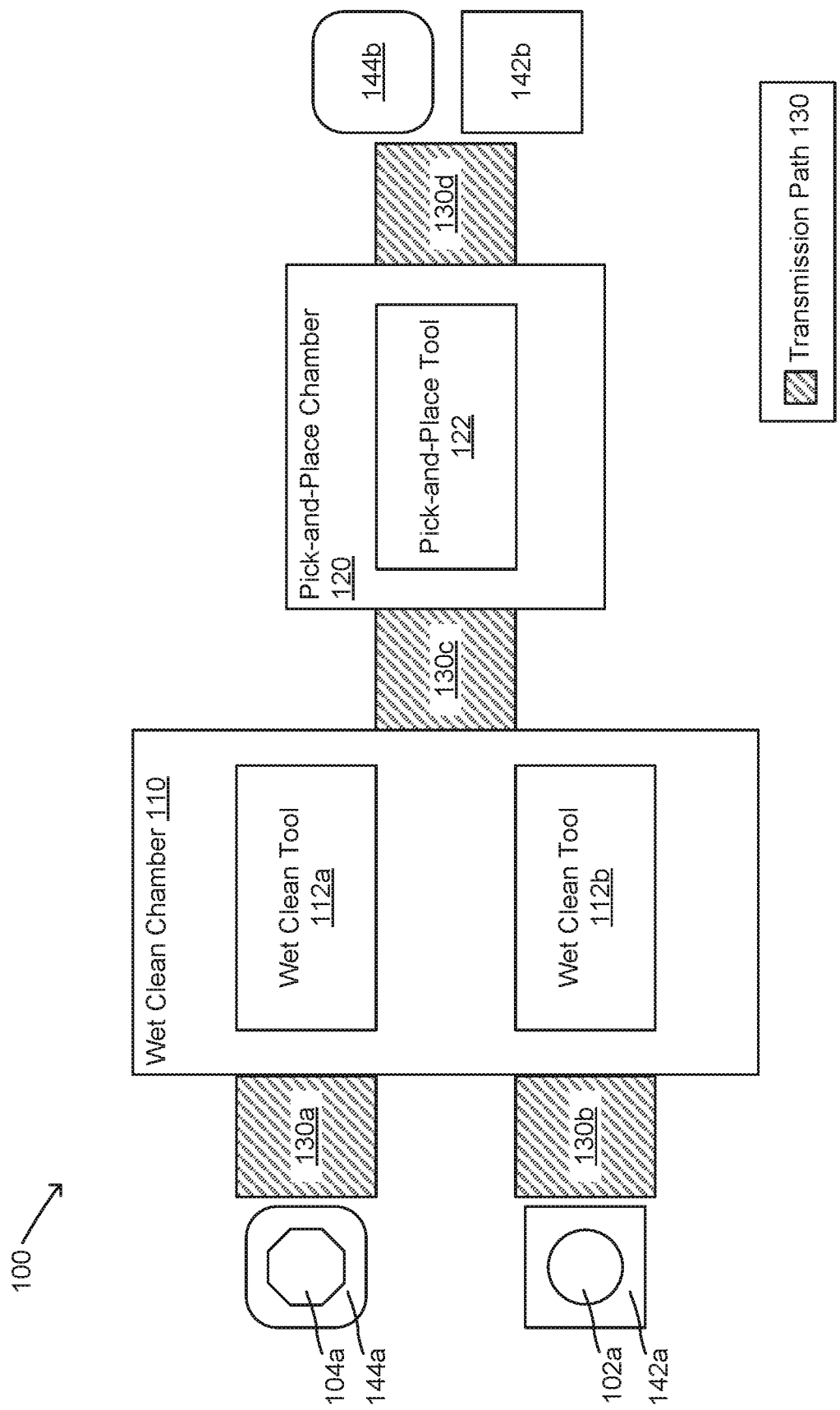
FIG. 1 is a diagram illustrating an example integrated semiconductor packaging system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Overview

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology often used in conjunction with hybrid bonding. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

Integrated Fan-Out (InFO) is another wafer-level packaging technology. InFO is a packaging technology that incorporates high-density redistribution layers (RDLs) and through InFO via (TIVs) for high-density interconnect and performance for various applications, such as mobile devices, high performance computing, etc. A wafer is typically diced into individual known good dies (KGDs) after testing, and the KGDs are placed on a temporary carrier with a certain distance apart. RDLs are formed subsequently to enable higher number of external contacts without increasing the size of KGDs.

On the other hand, those multiple chips that are bonded to the interposer in a CoWoS structure or embedded in an InFO structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding.

Stacking dies featuring ultra-high-density-vertical stacking (often using hybrid bonding) is sometimes referred to as System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

The dielectric-to-dielectric interface in either hybrid bonding or fusion bonding requires water ($H_2O$) as the bonding medium. Because of the presence of water as the bonding medium, silanol groups (i.e., Si—OH) exist at the surface of the silicon-containing dielectric (e.g., silicon dioxide, silicon oxynitride, etc.) layers at the dielectric-to-dielectric interface. In a polymerization process, the silanol groups (i.e., Si—OH) at both sides of the dielectric-to-dielectric interface polymerize to siloxane groups (i.e., Si—O—Si) and water (i.e., $H_2O$) in accordance with Si-OH+Si-OH→Si—O-Si+$H_2O$. As such, the top die and the bottom die are bonded together. In addition to serving as the bonding medium, water is also used to wash the wafers or chips to be bonded to eliminate unwanted particles at the bonding surfaces.

However, in a conventional semiconductor packaging system, the wet clean tools (e.g., a wet clean machine), which are configured to wash the wafers or chips, and the pick-and-place tool, which is configured to bond the top die to its corresponding bottom die, are not located together. For example, the wet clean tools and the pick-and-place tool are remotely located from each other (e.g., located at different areas in the fab with a certain distance). As a result, the wafers or chips are transferred from the wet clean tools to the pick-and-place tool, contained in, for example, wafer containers or frame containers (e.g., frame cassettes). During the transfer, the wafers or chips may risk contamination and surface drying.

In accordance with some aspects of the disclosure, an integrated semiconductor packaging system is provided. The integrated semiconductor packaging system includes a first wet clean tool configured to perform a first wet clean process on a frame and a second wet clean tool configured to perform a second wet clean process on a wafer. The first wet clean tool and the second wet clean tool are located in a wet clean chamber. The integrated semiconductor packaging system further includes a pick-and-place tool configured to bond top dies disposed on the frame to bottom dies disposed on the wafer. The pick-and-place tool is located in a pick-and-place chamber.

The frame is directly transferred from the first wet clean tool to the pick-and-place tool immediately after the first wet clean process ends, without placing the frame in a frame container. The wafer is directly transferred from the second wet clean tool to the pick-and-place tool immediately after the second wet clean process ends, without placing the wafer in a wafer container. Thus, the chance of contamination is significantly reduced. Additionally, the transition period between the end of the wet clean processes and the start of the bonding process performed by the pick-and-place tool is shortened, thereby reducing the risk of surface drying and improving the quality of the dielectric-to-dielectric bonding.

In addition, the environmental parameters of the wet clean chamber 110, the pick-and-place chamber 120, and the transmission paths 130 are controlled such that the wafer 102*a* and the frame 104*a* are in good conditions during the whole process (i.e., the wet clean processes, the bonding process using the pick-and-place tool 122, and the transfer processes).

Details of various aspects of the disclosure will be described below in detail with reference to FIGS. 1-6.

Example Integrated Semiconductor Packaging System for Die-to-Wafer Bonding

FIG. 1 is a diagram illustrating an example integrated semiconductor packaging system 100 in accordance with some embodiments. The integrated semiconductor packaging system 100 is configured to perform wet clean processes and bond top dies on a frame to the corresponding dies on a wafer. In other words, the integrated semiconductor packaging system 100 can be used at least in the context of die-to-wafer bonding.

In the example shown in FIG. 1, the integrated semiconductor packaging system 100 includes, among other components, a wet clean chamber 110, a pick-and-place chamber 120, transmission paths 130*a*, 130*b*, 130*c*, and 130*d* (collectively, "130"). The wet clean chamber 110 is a chamber where wet clean processes are performed. In the example shown in FIG. 1, two wet clean tools 112*a* and 112*b* are located in the wet clean chamber 110, which provides an environment for the wet clean tools 112a and 112b. The pick-and-place chamber 120 is a chamber where bonding processes are performed. In the example shown in FIG. 1, a pick-and-place tool 122 is located in the pick-and-place chamber 120. Details of bonding processes using the pick-and-place tool 122 will be described below with reference to FIG. 3.

In the example shown in FIG. 1, the wet clean chamber 110 interfaces the transmission paths 130a, 130b, and 130c. The transmission path 130a is a path where a frame 104a, contained in a frame container 144a, is transferred to the wet clean chamber 110. The transmission path 130b is a path where a wafer 102a, contained in a wafer container 142a, is transferred to the wet clean chamber 110. In the example shown in FIG. 1, the frame 104a is transferred to the wet clean tool 112a, whereas the wafer 102a is transferred to the wet clean tool 112b.

While only one wafer 102a is shown in FIG. 1, the wafer container 142a can accommodate a batch of wafers in some embodiments. In one embodiment, the wafer container 142a is a standard mechanical interface (SMIF) pod. In another embodiment, the wafer container 142a is a front opening unified pod (FOUP). It should be understood that other types of wafer containers 142a can be employed in other embodiments. While only one frame 104a is shown in FIG. 1, the frame container 144a can accommodate a batch of frames in some embodiments. It should be understood that various types of frame containers 144a can be employed in various embodiments.

The transmission path 130c is a path where the wafer 102a and the frame 104a are transferred to the pick-and-place chamber 120 and, specifically, the pick-and-place tool 122. In conventional semiconductor packaging systems, the wafer 102a and the frame 104a would be placed in a wafer container (often the wafer container 142a, i.e., the same wafer container that accommodates the wafer 102a before it is transferred to the wet clean chamber 110) and a frame container (often the frame container 144a, i.e., the same frame container that accommodates the frame 104a before it is transferred to the wet clean chamber 110) instead of being transferred directly to the pick-and-place chamber 120 through the transmission path 130c. As a result, the chance of contamination increases due to the placement in the wafer container or the frame container. On the other hand, the transition period between the end of the wet clean processes and the start of the bonding process performed by the pick-and-place tool 122 is prolonged as the wafer 102 and the frame 104a are not directly transferred to the pick-and-place chamber 120, increasing the risk of surface drying. As explained above, surface drying negatively impacts the dielectric-to-dielectric bonding.

In contrast, in the integrated semiconductor packaging system 100 shown in FIG. 1, the wafer 102a and the frame 104a are transferred directly to the pick-and-place chamber 120 through the transmission path 130c after the wet clean processes performed by the wet clean tools 112a and 112b, without placing the wafer 102a in a wafer container (often the wafer container 142a, i.e., the same wafer container that accommodates the wafer 102a before it is transferred to the wet clean chamber 110) and the frame 104a in a frame container (often the frame container 144a, i.e., the same frame container that accommodates the frame 104a before it is transferred to the wet clean chamber 110). Therefore, the chance of contamination is significantly reduced. Moreover, the wafer 102a and the frame 104a are transferred immediately after the wet clean processes, and the pick-and-place chamber 120 is located in close proximity to the wet clean chamber 110 in some embodiments, the transition period between the end of the wet clean processes and the start of the bonding process performed by the pick-and-place tool 122 is shortened, thereby reducing the risk of surface drying and improving the quality of the dielectric-to-dielectric bonding.

In some implementations, the transmission path 130c shown in FIG. 1 includes two conveyance mechanisms such that both the wafer 102a and the frame 104 can be transferred to the pick-and-place tool 122 located in the pick-and-place chamber 120 simultaneously. It should be understood that this is not intended to be limiting. In other implementations, the transmission path 130c may be replaced with two separate transmission paths, one transmission path is between the wet clean tool 112a and the pick-and-place tool 122 for the transfer of the frame 104a, and another transmission path is between the wet clean tool 112b and the pick-and-place tool 122 for the transfer of the wafer 102a. One of ordinary skill in the art would recognize many variations, modifications, and alternatives.

In the example shown in FIG. 1, the pick-and-place chamber 120 interfaces the transmission paths 130c and 130d. The transmission path 130d is a path where the frame 104a is transferred to another frame container 144b different from the frame container 144a and where the wafer 102a is transferred to another wafer container 142b different from the wafer container 142a. The wafer 102a therefore is transferred, in the wafer container 142b, to places for subsequent processes (e.g., testing, dicing, etc.). As the wafer container 142b is not the wafer container 142a, the wafer 102a, which has gone through the bonding process using the pick-and-place tool 122, will not be placed in the wafer container 142a, which may accommodate other wafers. As the bonding process using the pick-and-place tool 122 is a back-end process, particles may be introduced in the bonding process. As such, using a different wafer container 142b can prevent the wafer 102a, after going through the bonding process, from contaminating other wafers accommodated in the wafer container 142. Likewise, the frame 104a is transferred, in the frame container 144b, to another place for reuse.

As will be discussed below in detail with reference to FIG. 4, the environmental parameters of the wet clean chamber 110, the pick-and-place chamber 120, and the transmission paths 130 are controlled such that the wafer 102a and the frame 104a are in good conditions during the whole process (i.e., the wet clean processes, the bonding process using the pick-and-place tool 122, and the transfer processes). In some embodiments, each of the wet clean chamber 110, the pick-and-place chamber 120, and the transmission paths 130 has multiple sensors and corresponding adjustment units installed therein. The sensors are configured to measure the current values of various environmental parameters, and the corresponding adjustment units are configured to adjust the values of the various environmental parameters based on the current values. Details will be discussed below with reference to FIGS. 4 and 5.

Example Method Semiconductor Device Packaging

Figure 2:
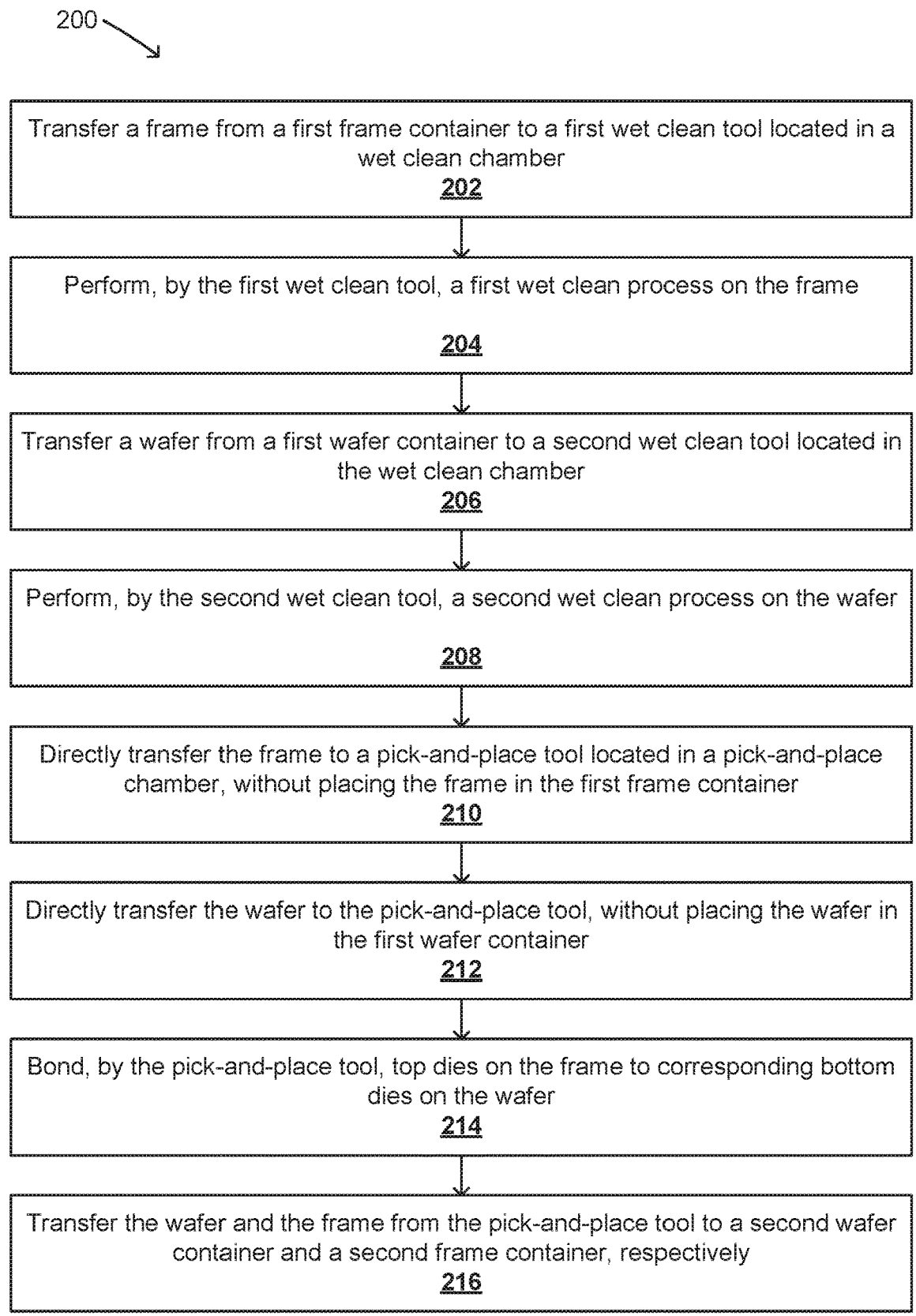
FIG. 2 is a flowchart diagram illustrating an example method for operating an integrated semiconductor packaging system in accordance with some embodiments.

FIG. 2 is a flowchart diagram illustrating an example method 200 for semiconductor device packaging in accordance with some embodiments. In the example shown in FIG. 2, the method 200 includes operations 202, 204, 206, 208, 210, 212, 214, and 216. Additional operations may be performed. Also, it should be understood that the sequence of the various operations discussed above with reference to FIG. 2 is provided for illustrative purposes, and as such, other embodiments may utilize different sequences. In one example, operations 206 and 208 can be performed before operations 202 and 204. In another example, operations 202 and 206 may be performed simultaneously, and operations 204 and 208 may be performed simultaneously as well. These various sequences of operations are to be included within the scope of embodiments.

At operation 202, a frame (e.g., the frame 104a shown in FIG. 1) is transferred from a first frame container (e.g., the frame container 144a shown in FIG. 1) to a first wet clean tool (e.g., the wet clean tool 112a shown in FIG. 1) located in a wet clean chamber (e.g., the wet clean chamber 110 shown in FIG. 1). In one implementation, the frame is transferred through a transmission path (e.g., the transmission path 130a shown in FIG. 1), the environmental parameters of which can be controlled. Top dies to be picked and bonded are placed or disposed on the frame.

At operation 204, a first wet clean process is performed on the frame. In one implementation, the first wet clean process is performed by the first wet clean tool located in the wet clean chamber. In other words, the top dies disposed on the frame are wetted in the first wet clean tool located in the wet clean chamber. During the first wet clean process, water is applied to the frame and, therefore, to the bonding surfaces of the top dies. The water serves as the bonding medium, as explained above. In the meantime, the water is used to wash the bonding surfaces of the top dies to eliminate unwanted particles at the bonding surfaces.

At operation 206, a wafer (e.g., the wafer 102a shown in FIG. 1) is transferred from a first wafer container (e.g., the wafer container 142a shown in FIG. 1) to a second wet clean tool (e.g., the wet clean tool 112b shown in FIG. 1) located in the wet clean chamber. In one implementation, the wafer is transferred through a transmission path (e.g., the transmission path 130b shown in FIG. 1), the environmental parameters of which can be controlled. Top dies placed or disposed on the frame are to be bonded to corresponding bottom dies disposed on the wafer.

At operation 208, a second wet clean process is performed on the wafer. In one implementation, the second wet clean process is performed by the second wet clean tool located in the wet clean chamber. In other words, the bottom dies disposed on the wafer are wetted in the second wet clean tool located in the wet clean chamber. During the second wet clean process, water is applied to the wafer and, therefore, to the bonding surfaces of the wafer. The water serves as the bonding medium, as explained above. In the meantime, the water is used to wash the bonding surfaces of the wafer to eliminate unwanted particles at the bonding surfaces.

At operation 210, the frame is directly transferred to a pick-and-place tool (e.g., the pick-and-place tool 122 shown in FIG. 1) located in a pick-and-place chamber (e.g., the pick-and-place chamber 120 shown in FIG. 1). In one implementation, the frame is directly transferred to the pick-and-place tool located in the pick-and-place chamber through a transmission path (e.g., the transmission path 130c shown in FIG. 1) after the first wet clean process is performed. In one example, the transfer of the frame is immediately after the first wet clean process is performed. In other words, there is no waiting period between the end of the first wet clean process and the transfer of the frame from the first wet clean tool to the pick-and-place tool. In one embodiment, the frame is directly transferred to the pick-and-place tool located in the pick-and-place chamber through the transmission path after the first wet clean process is performed, without placing the frame in the first frame container.

At operation 212, the wafer is directly transferred to the pick-and-place tool located in the pick-and-place chamber. In one implementation, the wafer is directly transferred to the pick-and-place tool located in the pick-and-place chamber through a transmission path (e.g., the transmission path 130c shown in FIG. 1) after the second wet clean process is performed. In one example, the transfer of the wafer is immediately after the second wet clean process is performed. In other words, there is no waiting period between the end of the second wet clean process and the transfer of the wafer from the second wet clean tool to the pick-and-place tool. In one embodiment, the wafer is directly transferred to the pick-and-place tool located in the pick-and-place chamber through the transmission path after the second wet clean process is performed, without placing the wafer in the first wafer container.

At operation 214, tops dies on the frame are bonded to the corresponding bottom dies on the wafer. In one implementation, the top dies are bonded to the corresponding bottom dies using the pick-and-place tool. Details of an example pick-and-place tool will be discussed below with reference to FIG. 3.

At operation 216, the wafer is transferred from the pick-and-place tool to a second wafer container (e.g., the wafer container 142b shown in FIG. 1), whereas the frame is transferred from the pick-and-place tool to a second frame container (e.g., the frame container 144b shown in FIG. 1). As explained above, the second wafer container is different from the first wafer container, and the wafer, which has gone through the bonding process using the pick-and-place tool, will not be placed in the first wafer container, which may accommodate other wafers. As such, using a different wafer container can prevent the wafer, after going through the bonding process, from contaminating other wafers accommodated in the first wafer container. Likewise, the second frame container is different from the first frame container, and the frame will not be placed in the first frame container, which may accommodate other frames. As such, contamination of the other frames in the first frame container can be prevented.

Example Pick-and-Place Tool and Operations Thereof

For die-to-wafer boding and die-to-die boding, which involve stacking a die on a wafer, a die on an interposer, or a die on a die, the infrastructure to handle dies without particle adders, as well as the ability to bond dies, becomes a major challenge. Typically, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility.

Pick-and-place tools (sometimes also referred to as "pick-and-place systems") are part of the infrastructure to handle dies in the context of die-to-wafer boding and die-to-die boding. A pick-and-place system is an automatic system that can pick a die (often referred to as a "top die") and place it onto another die (often referred to as a "bottom die") or a host wafer, often in a high-speed manner. A person may take the complexity and difficulty of such tasks of picking and placing a top die for granted. On the contrary, accurate alignment of dies, without comprising the high system throughput, is very challenging, especially considering that the alignment accuracies are on the order of microns (i.e., micrometers). If the position shift error cannot be further reduced, the critical size of hybrid bonding metal pads cannot be reduced, which in turn limits bonding density.

Figure 3:
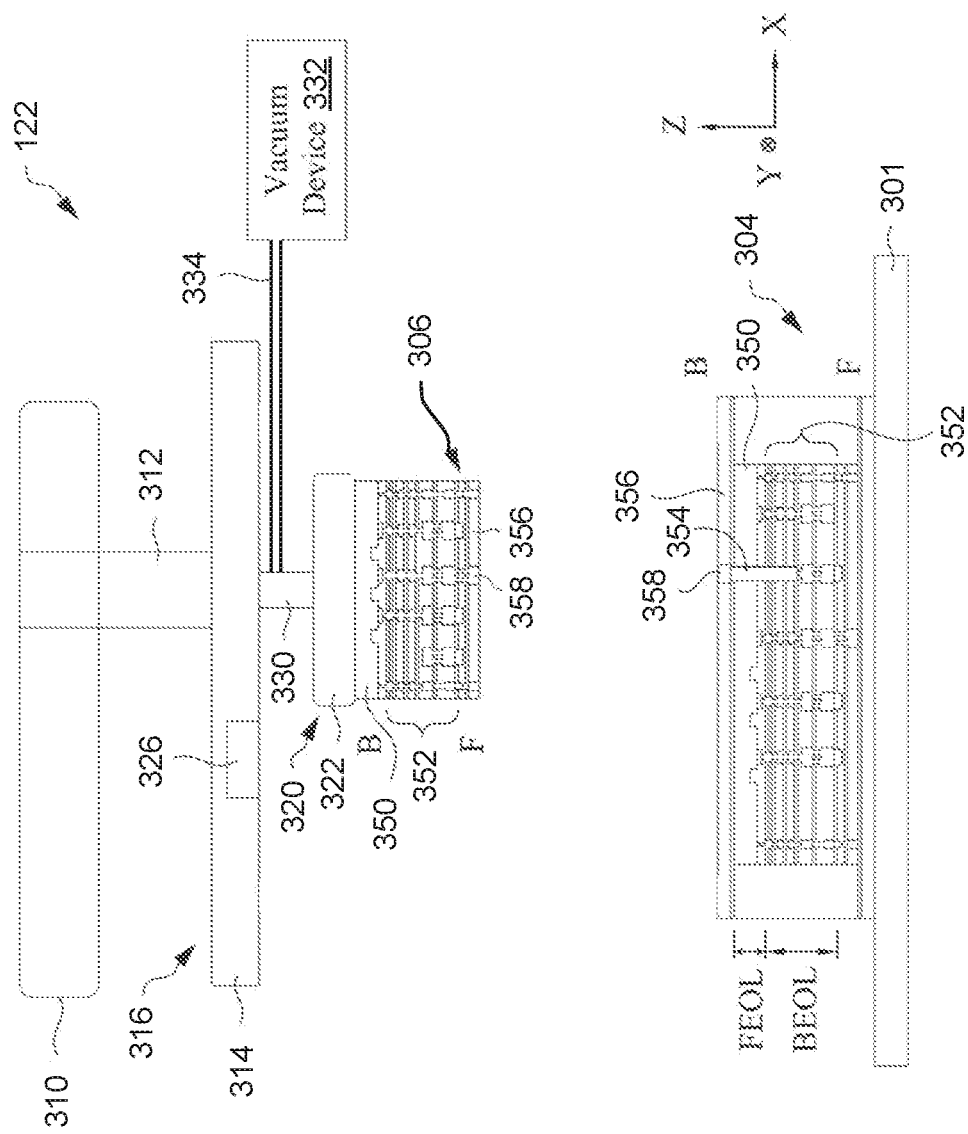
FIG. 3 is a schematic diagram illustrating an example pick-and-place tool in accordance with some embodiments.

FIG. 3 is a schematic diagram illustrating an example pick-and-place tool 122 in accordance with some embodiments. In the example shown in FIG. 3, the pick-and-place tool 122 includes a wafer holder 301, a primary drive mechanism 310, an attaching shaft 312, a gantry 314, a secondary drive mechanism 316, a suction head 320, a suction shaft 330, a vision alignment camera 326, and a vacuum device 332. It should be understood that more or fewer components than those shown in FIG. 3 can be employed in other examples. For example, the pick-and-place tool 122 may further include a control unit, a vision alignment processor, a memory device, a display, and an I/O device in other embodiments. In the example shown in FIG. 3, the pick-and-place tool 122 can pick a top die 306, which typically comes from a component wafer on the frame 104a after a dicing process, and place the top die 306 on a bottom die 304, which is disposed on the wafer 102a shown in FIG. 1.

The wafer holder 301 is used to hold the wafer 102a on which the bottom die 304 is disposed. It should be understood that the techniques discussed in the disclosure can be applied to the die-to-die bonding context and the die-to-wafer bonding context.

In the example shown in FIG. 3, the bottom die 304 has a front side (denoted as "F" in FIG. 3) and a back side (denoted as "B" in FIG. 3). In the example shown in FIG. 3, the bottom die 304 has been flipped, i.e., upside down. A bonding layer 356 is formed at the back side and on a silicon substrate 350. In one implementation, the bonding layer 356 is made of a dielectric and can be used for bonding with another bonding layer 356 at the top die 306.

One or more semiconductor devices (e.g., transistors, resistors, capacitors, inductors, etc.) are formed on the silicon substrate 350, before being flipped, in a front-end-of-line (FEOL) process. A multilayer interconnect (MLI) structure 352 is disposed over the one or more semiconductor devices, before being flipped. The MLI structure 352 includes a combination of dielectric layers and conductive layers configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 352. During operation of bottom die 304, the interconnect structures are configured to route signals and/or distribute signals (e.g., clock signals, voltage signals, ground signals) to the one or more semiconductor devices to fulfill certain functions. It should be understood that although the MLI structure 352 is depicted in FIG. 3 with a given number of dielectric layers and conductive layers, the present disclosure contemplates MLI structures having more or fewer dielectric layers and/or conductive layers depending on design requirements of the bottom die 304.

In the example shown in FIG. 3, the bottom die 304 includes a hybrid bonding metal pad 358 formed in the bonding layer 356, and the hybrid bonding metal pad 358 is connected to the MLI structure 352 through a through-silicon via (TSV) 354, which penetrates the silicon substrate 350 in a vertical direction (i.e., a Z-direction). It should be understood that although only one hybrid bonding metal pad 358 and a TSV 354 is shown in FIG. 3, this is not intended to be limiting.

Likewise, the top die 306 has a front side (denoted as "F" in FIG. 3) and a back side (denoted as "B" in FIG. 3). In the example shown in FIG. 3, the top die 306 has been flipped, i.e., upside down. The silicon substrate 350 of the top die 306 is held (e.g., sucked) to and in contact with the suction head 320, details of which will be described below. A bonding layer 356 is formed at the front side and over a MLI structure 352, before the top die 306 is flipped. In one implementation, the bonding layer 356 is made of a dielectric and can be used for bonding with the bonding layer 356 at the bottom die 304, as mentioned above. Likewise, the top die 306 includes a hybrid bonding metal pad 358 formed in the bonding layer 356, and the hybrid bonding metal pad 358 is connected to the MLI structure 352 through, for example, a via. It should be understood that although only one hybrid bonding metal pad 358 and a TSV 354 are shown in FIG. 3, this is not intended to be limiting.

The top die 306 is picked by the suction head 320, and then the pick-and-place tool 122 controls the suction head 320 accordingly to move the top die 306 to a target position, for example, right over the bottom die 304. Subsequently, the suction head 320 places the top die 306 onto the bottom die 304. The top die 306 and the bottom die 304 are bonded because of the bonding layers 356 on each side, in some implementations at room temperatures. In the meantime, the hybrid bonding metal pads 358 on each side are in contact with each other, forming an electrical connection path between the top die 306 and the bottom die 304.

The primary drive mechanism 310 and the gantry 314 are connected through the attaching shaft 312. The primary drive mechanism 310 can drive the gantry 314 both in the vertical direction (i.e., the Z-direction) and in the horizontal plane (i.e., the X-Y plane, that is in the X-direction and/or the Y-direction). In one implementation, the primary drive mechanism 310 is an actuator, a rail, a continuous track, a stepper motor, gears, belts, or a combination thereof. It should be understood that this is not intended to be limiting, and other implementations of the primary drive mechanism 310 are within the scope of the disclosure.

The gantry 314 and the suction head 320 are connected through the suction shaft 330. A secondary drive mechanism 316 is located at the gantry 314 and can drive the suction head 320 both in the vertical direction (i.e., the Z-direction) and in the horizontal plane (i.e., the X-Y plane, that is in the X-direction and/or the Y-direction). In one implementation, the secondary drive mechanism 316 is an actuator, a stepper motor, or a combination thereof. In another implementation, the secondary drive mechanism 316 drives the suction head 320 by using magnetic forces. It should be understood that this is not intended to be limiting, and other implementations of the secondary drive mechanism 316 are within the scope of the disclosure.

The vision alignment camera 326 is located at the gantry 314. The vision alignment camera 326 is a downward camera that can detect the exact position of the gantry 314 relative to the bottom die 304. A vision alignment processor may be utilized to assist the primary drive mechanism 310 in driving the gantry 314 to a target gantry position. In some embodiments, some alignment patterns can be formed on the bottom die 304. The vision alignment processor and the vision alignment camera 326 can utilize the alignment patterns to adjust the position of the gantry 314 accordingly to achieve an accurate landing of the top die 306.

The vacuum device 332 is connected to the suction shaft 330 through a pipe 334. The suction shaft 330 is hollow and has a passage in the middle that extends in the Z-direction. When the vacuum device 332 operates, the suction head 320 generates a suction force to hold the top die 306 to a bonder region 322 of the suction head 320. In some embodiments, the suction head 320 may also include an auxiliary region, which accommodates an optics alignment system. The optics alignment system is configured to assist the suction head 320 to adjust its position accordingly and place the top die 306 at the target position, with the help of a control unit. The control unit is configured to execute computer program codes stored in a memory device in order to cause the pick-and-place tool 122 to fulfill its various functions. It should be understood that the vision alignment processor can be a portion of the control unit in some embodiments.

Example Control System

Figure 4:
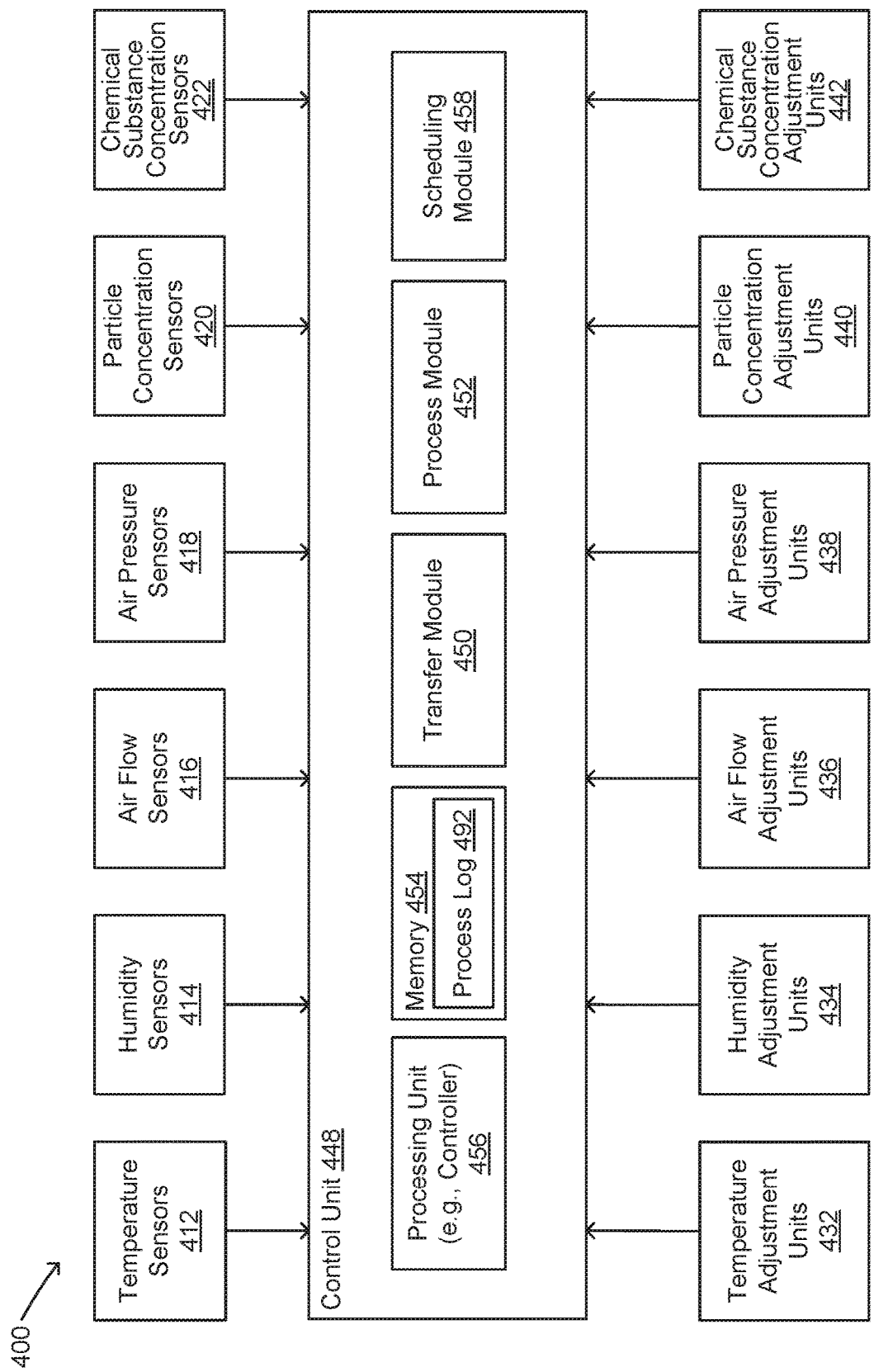
FIG. 4 is a diagram illustrating an example control system of an integrated semiconductor packaging system in accordance with some embodiments.

FIG. 4 is a diagram illustrating an example control system 400 of an integrated semiconductor packaging system 100 in accordance with some embodiments. As explained above, each of the wet clean chamber 110, the pick-and-place chamber 120, and the transmission paths 130 shown in FIG. 1 has multiple sensors and corresponding adjustment units installed therein, and the environmental parameters of the environmental parameters of the wet clean chamber 110, the pick-and-place chamber 120, and the transmission paths 130 are controlled such that the wafer 102a and the frame 104a are in good conditions during the whole process.

In the example shown in FIG. 4, the control system 400 includes, among other components, a control unit 448, multiple sensors, and corresponding adjustment units. In the example shown in FIG. 4, the multiple sensors include temperature sensors 412, humidity sensors 414, air flow sensors 416, air pressure sensors 418, particle concentration sensors 420, chemical substance concentration sensors 422, and the corresponding adjustment units include temperature adjustment units 432, humidity adjustment units 434, air flow adjustment units 436, air pressure adjustment units 438, particle concentration adjustment units 440, and chemical substance concentration adjustment units 442.

While these sensors and corresponding adjustment units are included in the example control system 400 shown in FIG. 4, it should be understood that the control system 400 may include more or fewer sensors and corresponding adjustment units in other embodiments. One of ordinary skill in the art would recognize many variations, modifications, and alternatives. The sensors are configured to measure the current values of various environmental parameters, and the corresponding adjustment units are configured to adjust the values of the various environmental parameters based on the current values.

In the example shown in FIG. 4, the control unit 448 includes, among other things, a processing unit 456, a memory 454, a transfer module 450, a process module 452, and a scheduling module 458. It should be understood that the control unit 448 may include other components in other embodiments as needed. The control unit is electrically connected to the temperature sensors 412, the humidity sensors 414, the air flow sensors 416, the air pressure sensors 418, the particle concentration sensors 420, the chemical substance concentration sensors 422 to receive current values of the various environmental parameters (e.g., the temperature, the humidity, the air flow, the air pressure, the particle concentration, and the concentration of a specific chemical substance for each of the wet clean chamber 110, the pick-and-place chamber 120, and the transmission paths 130). The control unit is also electrically connected to the temperature adjustment units 432, the humidity adjustment units 434, the air flow adjustment units 436, the air pressure adjustment units 438, the particle concentration adjustment units 440, and the chemical substance concentration adjustment units 442 to adjust the environmental parameters to be within corresponding acceptable ranges.

The processing unit 456 is configured to execute codes or instructions stored in the memory 454 to cause the control unit 448 to perform various functions disclosed herein. In one embodiment, the processing unit 456 is a central processing unit (CPU), a multi-processor, a distributed processing system, an application specific integrated circuit (ASIC), a controller, and/or a suitable processing unit.

The memory 454 is configured to store the codes or instructions that are executed by the processing unit 456. In some embodiments, the memory 454 also stores the process log 492. In various implementations, the memory 454 may include one or more of a solid-state memory, a magnetic tape, a removable computer diskette, a random-access memory (RAM), a read-only memory (ROM), a rigid magnetic disk, an optical disk, and/or a suitable memory device.

The transfer module 450 is configured to control transfer mechanisms (e.g., conveyance mechanisms, transfer robots, etc.) to transfer the wafer 102a and the frame 104a through the transmission paths 130. The process module 452 is configured to control the wet clean processes performed by the wet clean tools 112a and 112b and the bonding process performed by the pick-and-place tool 122. In one implementation, the process module 452 obtains the process log 492 stored in the memory 454 and sends control signals to the wet clean tools 112a and 112b and the pick-and-place tool 122 to operate them according to the process log 492.

The scheduling module 458 is configured to schedule and coordinate various operations of the integrated semiconductor packaging system 100. For instance, the scheduling module 458 can coordinate the timing of the process module 452 and the transfer module 450 such that the wafer 102a is transferred from the wet clean tool 112b to the pick-and-place tool 122 immediately after the wet clean process performed by the wet clean tool 112b ends. Likewise, the scheduling module 458 can coordinate the timing of the process module 452 and the transfer module 450 such that the frame 104a is transferred from the wet clean tool 112a to the pick-and-place tool 122 immediately after the wet clean process performed by the wet clean tool 112a ends. Additionally, the scheduling module 458 can coordinate the timing of the process module 452 and the transfer module 450 such that the bonding process performed by the pick-and-place tool 122 starts immediately after both the wafer 102a and the frame 104a are transferred to the pick-and-place tool 122.

The temperature sensors 412 are configured to measure the current values of temperatures at the wet clean chamber 110, the pick-and-place chamber 120, and the transmission paths 130. The temperature adjustment units 432 are configured to adjust the temperatures at the wet clean chamber 110, the pick-and-place chamber 120, and the transmission paths 130 based on the current values of the temperatures. In some implementations, each of the temperature sensors 412 is one or more of a thermocouple, a resistance temperature detector (RTD), a thermistor, and a semiconductor-based integrated circuit. In some implementations, each of the temperature adjustment units 432 is a combination of a heater configured to increase the temperatures and a cooling liquid system configured to decrease the temperatures. It should be understood that other types of temperature sensors 412 and temperature adjustment units 432 may be employed in other implementations. In one example, the target temperature range is between 0° C. and 100° C. In another example, the target temperature range is between 20° C. and 40° C. In yet another example, the target temperature is 25° C.

The humidity sensors 414 are configured to measure the current values of humidities at the wet clean chamber 110, the pick-and-place chamber 120, and the transmission paths 130. The humidity adjustment units 434 are configured to adjust the humidities at the wet clean chamber 110, the pick-and-place chamber 120, and the transmission paths 130 based on the current values of the humidities. In some implementations, each of the humidity sensors 414 is one or more of capacitive hygrometers, resistive hygrometers, thermal hygrometers, and optical hygrometers. In some implementations, each of the humidity adjustment units 434 is one or more of a humidifier configured to increase the humidities and a dehumidifier configured to decrease the humidities. It should be understood that other types of humidity sensors 414 and humidity adjustment units 434 may be employed in other implementations. In one example, the target (relative) humidity range is between 1% and 100%. In another example, the target (relative) humidity range is between 20% and 60%.

The air flow sensors 416 are configured to measure the current values of air flows at the wet clean chamber 110, the pick-and-place chamber 120, and the transmission paths 130. The air flow adjustment units 436 are configured to adjust the air flows at the wet clean chamber 110, the pick-and-place chamber 120, and the transmission paths 130 based on the current values of the air flows. In some implementations, each of the air flow sensors 416 is a mass air flow (MAF) sensor. In some implementations, each of the air flow adjustment units 436 is one or more of an air flow control valve, an air flow regulator, a Venturi valve. It should be understood that other types of air flow sensors 416 and air flow adjustment units 436 may be employed in other implementations. In one example, the target air flow range is between 0 and 100 m$^2$/sec. In another example, the target air flow range is between 0 and 0.05 m$^2$/sec. In yet another example, the target air flow is 0.01 m$^2$/sec.

The air pressure sensors 418 are configured to measure the current values of air pressures at the wet clean chamber 110, the pick-and-place chamber 120, and the transmission paths 130. The air pressure adjustment units 438 are configured to adjust the air pressures at the wet clean chamber 110, the pick-and-place chamber 120, and the transmission paths 130 based on the current values of the air pressures. In some implementations, each of the air pressure sensors 418 is one or more of a barometer, an aneroid barometer, a MEMS barometer, and other barometric pressure sensors. In some implementations, each of the air pressure adjustment units 438 is one or more of an air compressor, an air pressure adjustment valve, and other air pressure adjustment units. It should be understood that other types of air pressure sensors 418 and air pressure adjustment units 438 may be employed in other implementations. In one example, the target air pressure range is between 0.01 atm (i.e., atmosphere) and 10 atm. In another example, the target air pressure range is between 0.5 atm and 1.5 atm. In yet another example, the target air pressure is 1 atm.

The particle concentration sensors 420 are configured to measure the current values of particle concentrations at the wet clean chamber 110, the pick-and-place chamber 120, and the transmission paths 130. The particle concentration adjustment units 440 are configured to adjust the particle concentration at the wet clean chamber 110, the pick-and-place chamber 120, and the transmission paths 130 based on the current values of the air pressures. In some implementations, each of the particle concentration sensors 420 is a particulate matter sensor. In some implementations, each of the particle concentration adjustment units 440 is one or more of a clean air system, an air purifier, and other particle concentration adjustment units. It should be understood that other types of particle concentration sensors 420 and particle concentration adjustment units 440 may be employed in other implementations. In one example, the target particle concentration range is between class 0 and class 1000 under the federal standard FED-STD-209 E (i.e., "Airborne Particulate Cleanliness Classes in Cleanrooms and Cleanzones"). The particle concentration of particles with a size equal to or larger than 0.1 μm is no larger than 1,000,000 per cubic meter. In another example, the target particle concentration range is between class 0 and class 1 under the federal standard FED-STD-209 E. The particle concentration of particles with a size equal to or larger than 0.1 μm is no larger than 1,000 per cubic meter. In yet another example, the target particle concentration is lower than 100 per cubic meter.

The chemical substance concentration sensors 422 are configured to measure the current values of chemical substance concentrations at the wet clean chamber 110, the pick-and-place chamber 120, and the transmission paths 130. The chemical substance concentration adjustment units 442 are configured to adjust the chemical substance concentrations at the wet clean chamber 110, the pick-and-place chamber 120, and the transmission paths 130 based on the current values of the air pressures. In one embodiment, the chemical substance concentration is a total volatile organic compound (TVOC). Volatile organic compounds are organic chemicals that become a gas at room temperature.

In some implementations, each of the chemical substance concentration sensors 422 is one or more of a MEMS chemical substance sensor and other chemical substance concentration sensors. In some implementations, each of the chemical substance concentration adjustment units 442 is one or more of a clean air system, an air purifier, and other chemical substance concentration adjustment units. It should be understood that other types of chemical substance concentration sensors 422 and chemical substance concentration adjustment units 442 may be employed in other implementations. In one example, the target chemical substance range is between 0 ppm (i.e., parts per million) and 1000 ppm. In another example, the target air pressure range is between 0 ppm and 0.01 ppm.

Figure 5:
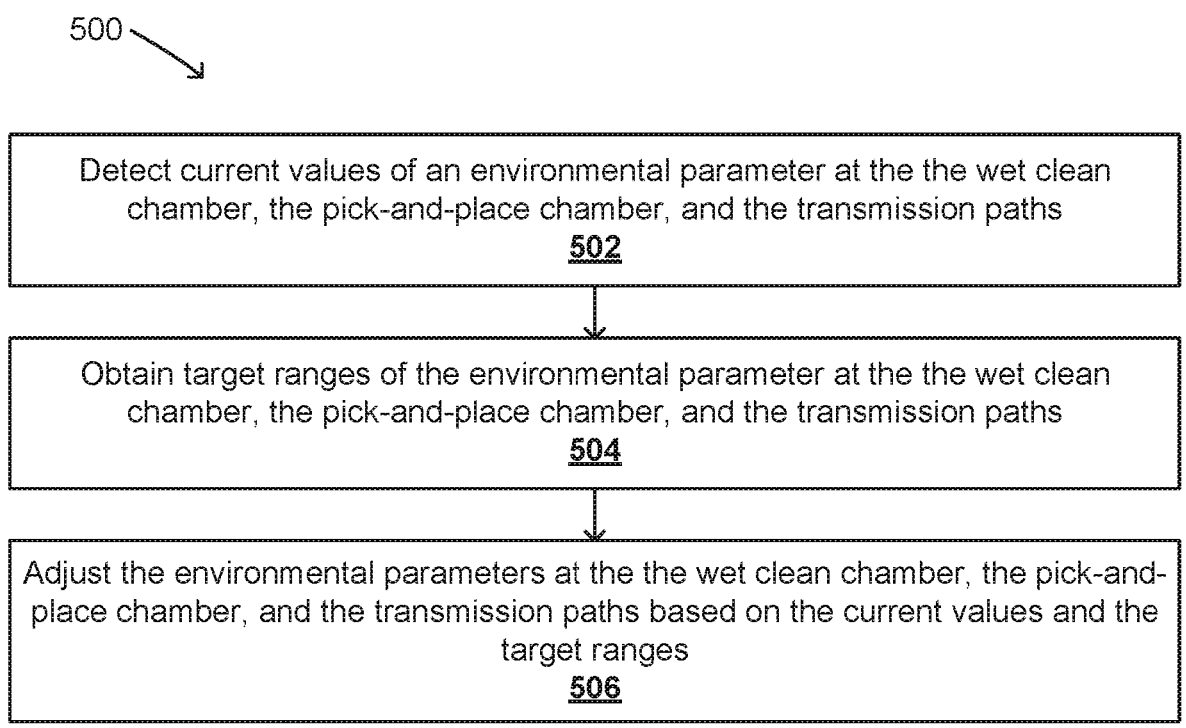
FIG. 5 is a flowchart diagram illustrating an example method in accordance with some embodiments.

FIG. 5 is a flowchart diagram illustrating an example method 500 in accordance with some embodiments. In the example shown in FIG. 5, the method 500 includes operations 502, 504, and 506. Additional operations may be performed. Also, it should be understood that the sequence of the various operations discussed above with reference to FIG. 5 is provided for illustrative purposes, and as such, other embodiments may utilize different sequences. These various sequences of operations are to be included within the scope of embodiments.

At operation 502, current values of an environmental parameter (e.g., the temperature) at the wet clean chamber 110, the pick-and-place chamber 120, and the transmission paths 130 are detected. In one implementation, the current values of the environment parameter are detected by sensors (e.g., temperature sensors) located at the wet clean chamber 110, the pick-and-place chamber 120, and the transmission paths 130. While one environmental parameter is mentioned, it should be noted that various environmental parameters can be monitored and adjusted using the method 500.

At operation 504, target ranges of the environmental parameter at the wet clean chamber 110, the pick-and-place chamber 120, and the transmission paths 130 are obtained. In one implementation, the target ranges are stored in and retrieved from the memory 454 shown in FIG. 4. In one embodiment, the target ranges of the environmental parameter at the wet clean chamber 110, the pick-and-place chamber 120, and the transmission paths 130 are identical. In another embodiment, the target ranges of the environmental parameter at the wet clean chamber 110, the pick-and-place chamber 120, and the transmission paths 130 are different.

At operation 506, the environmental parameters at the wet clean chamber 110, the pick-and-place chamber 120, and the transmission paths 130 are adjusted based on the current values detected at operation 502 and the target ranges obtained at operation 504. In one implementation, the environmental parameters are adjusted by adjustment units (e.g., temperature adjustment sensors) located at the wet clean chamber 110, the pick-and-place chamber 120, and the transmission paths 130.

Example Integrated Semiconductor Packaging System for Wafer-to-Wafer Bonding

Figure 6:
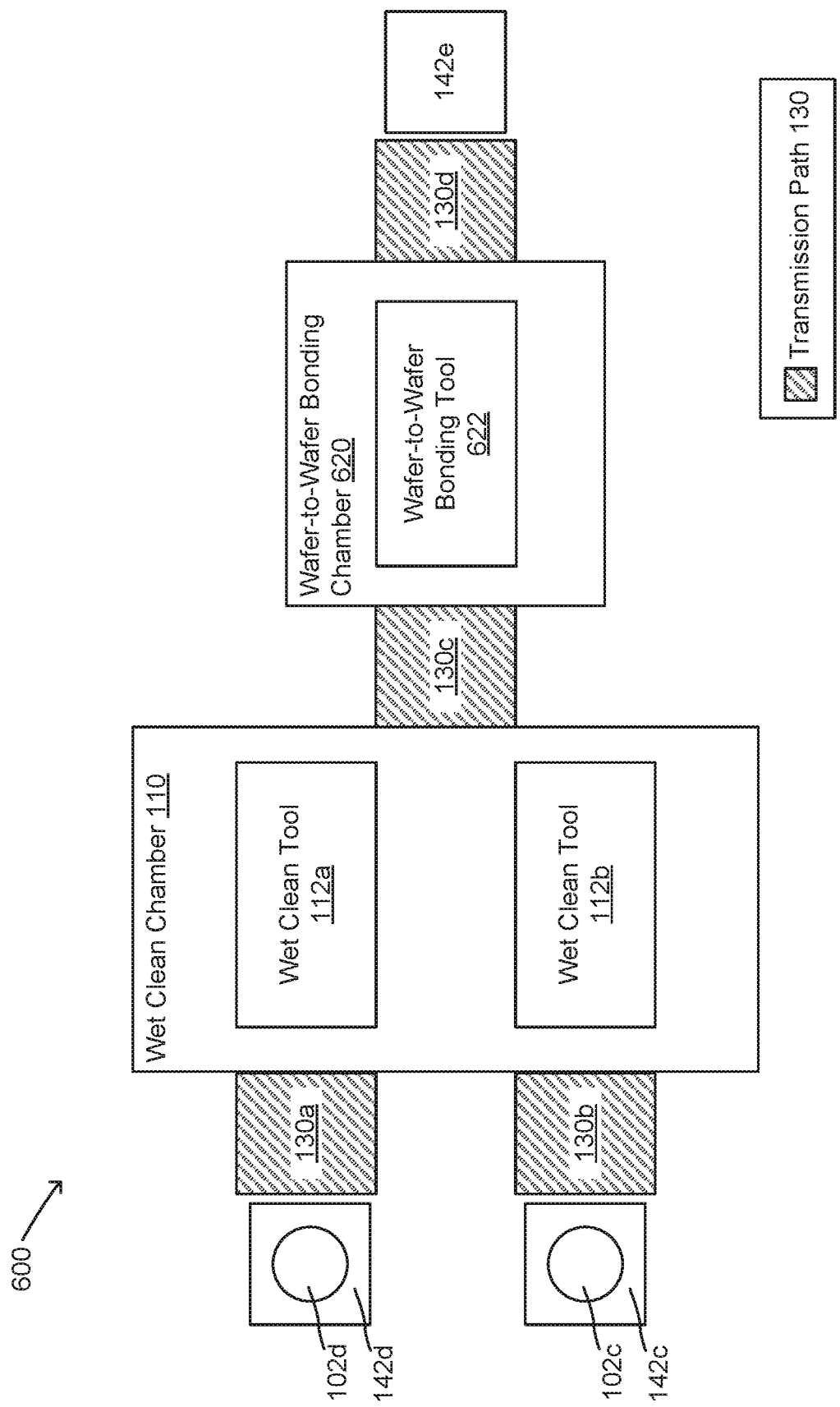
FIG. 6 is a diagram illustrating an example integrated semiconductor packaging system in accordance with some embodiments.

The techniques discussed above can be applied to not only die-to-wafer bonding or die-to-die bonding but also wafer-to-wafer bonding. FIG. 6 is a diagram illustrating an example integrated semiconductor packaging system 600 in accordance with some embodiments. The integrated semiconductor packaging system 600 is configured to perform wet clean processes and bond a top wafer to a bottom wafer. Many components of the integrated semiconductor packaging system 600 are similar to or identical to the counterpart components of the integrated semiconductor packaging system 100 shown in FIG. 1. Therefore, these components will not be described in detail.

In the example shown in FIG. 6, the integrated semiconductor packaging system 600 includes, among other components, a wet clean chamber 110, a wafer-to-wafer bonding chamber 620, transmission paths 130*a*, 130*b*, 130*c*, and 130*d* (collectively, "130"). The wafer-to-wafer bonding chamber 620 is a chamber where wafer-to-wafer bonding processes are performed. In the example shown in FIG. 6, a wafer-to-wafer bonding tool 622 is located in the wafer-to-wafer bonding chamber 620.

A bottom wafer 102*c* is accommodated in a wafer container 142*c* and transferred to the wet clean tool 112*b* through the transmission path 130*b*, whereas a top wafer 102*d* is accommodated in a wafer container 142*d* and transferred to the wet clean tool 112*a* through the transmission path 130*a*. After the wafer-to-wafer bonding process is performed by the wafer-to-wafer bonding tool 622, both the wafer-to-wafer package is transferred to another wafer container 142*e* through the transmission path 130*d* for subsequent processes (e.g., testing, dicing, etc.).

In the integrated semiconductor packaging system 600 shown in FIG. 6, the bottom wafer 102*c* and the top wafer 102*d* are transferred directly to the wafer-to-wafer bonding chamber 620 through the transmission path 130*c* after the wet clean processes performed by the wet clean tools 112*a* and 112*b*, without placing the bottom wafer 102*c* in a wafer container (often the wafer container 142*c*, i.e., the same wafer container that accommodates the bottom wafer 102*c* before it is transferred to the wet clean chamber 110) and the top wafer 102*d* in a wafer container (often the wafer container 142*d*, i.e., the same frame container that accommodates the top wafer 102*d* before it is transferred to the wet clean chamber 110). Therefore, the chance of contamination is significantly reduced. Moreover, the bottom wafer 102*c* and the top wafer 102*d* are transferred immediately after the wet clean processes, and the wafer-to-wafer bonding chamber 620 is located in close proximity to the wet clean chamber 110 in some embodiments, the transition period between the end of the wet clean processes and the start of the wafer-to-wafer bonding process performed by the wafer-to-wafer bonding tool 622 is shortened, thereby reducing the risk of surface drying and improving the quality of the dielectric-to-dielectric bonding.

One of ordinary skill in the art would appreciate that the techniques described with reference to FIGS. 4 and 5 are also applicable to the integrated semiconductor packaging system 600. The integrated semiconductor packaging system 600 includes multiple sensors and multiple adjustment units. The sensors are configured to measure current values of environmental parameters at the wet clean chamber 110, the wafer-to-wafer bonding chamber 620, and the transmission paths 130. The adjustment units are configured to adjust the environmental parameters at the wet clean chamber 110, the wafer-to-wafer bonding chamber 620, and the transmission paths 130 based on the current values of the environmental parameters.

SUMMARY

In accordance with some aspects of the disclosure, an integrated semiconductor packaging system is provided. The integrated semiconductor packaging system includes: a first wet clean tool configured to perform a first wet clean process on a frame, wherein a plurality of top dies are disposed on the frame; a second wet clean tool configured to perform a second wet clean process on a wafer, wherein a plurality of bottom dies corresponding to the plurality of top dies, respectively, are disposed on the wafer; a pick-and-place tool configured to bond the plurality of top dies to the plurality of bottom dies, respectively; and a first transmission path through which the frame and the wafer are transferred from the first wet clean tool and the second wet clean tool to the pick-and-place tool, respectively, wherein the frame is directly transferred from the first wet clean tool to the pick-and-place tool, and the wafer is directly transferred from the second wet clean tool to the pick-and-place tool.

In accordance with some aspects of the disclosure, a method of semiconductor device packaging is provided. The method includes the following steps: wetting a plurality of top dies disposed on a frame in a first wet clean tool located in a wet clean chamber; wetting a plurality of bottom dies disposed on a wafer in a second wet clean tool located in the wet clean chamber, the plurality of bottom dies corresponding to the plurality of top dies, respectively; transferring the frame to a pick-and-place tool located in a pick-and-place chamber, without placing the frame in a frame container; transferring the wafer to the pick-and-place tool, without placing the wafer in a wafer container; and bonding, by the pick-and-place tool, the plurality of top dies to the plurality of bottom dies, respectively.

In accordance with some aspects of the disclosure, an integrated semiconductor packaging system is provided. The integrated semiconductor packaging system includes: a first wet clean tool configured to perform a first wet clean process on a top wafer, wherein a plurality of top dies are disposed on the top wafer; a second wet clean tool configured to perform a second wet clean process on a bottom wafer, wherein a plurality of bottom dies corresponding to the plurality of top dies, respectively, are disposed on the bottom wafer; a wafer-to-wafer bonding tool configured to bond the top wafer to the bottom wafer, the plurality of top dies being bonded to the plurality of bottom dies, respectively; and a first transmission path through which the top wafer and the bottom wafer are transferred from the first wet clean tool and the second wet clean tool to the wafer-to-wafer bonding tool, respectively, wherein the top wafer is directly transferred from the first wet clean tool to the wafer-to-wafer bonding tool, and the bottom wafer is directly transferred from the second wet clean tool to the wafer-to-wafer bonding tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated semiconductor packaging system comprising:
   a first wet clean tool configured to perform a first wet clean process on a frame, wherein a plurality of top dies are disposed on the frame;
   a second wet clean tool configured to perform a second wet clean process on a wafer, wherein a plurality of bottom dies corresponding to the plurality of top dies, respectively, are disposed on the wafer;
   a pick-and-place tool configured to bond the plurality of top dies to the plurality of bottom dies, respectively; and
   a first transmission path through which the frame and the wafer are transferred from the first wet clean tool and the second wet clean tool to the pick-and-place tool, respectively, wherein the frame is directly transferred from the first wet clean tool to the pick-and-place tool, and the wafer is directly transferred from the second wet clean tool to the pick-and-place tool.

2. The integrated semiconductor packaging system of claim 1, wherein the frame is transferred from the first wet clean tool to the pick-and-place tool immediately after the first wet clean process ends.

3. The integrated semiconductor packaging system of claim 2, wherein the wafer is transferred from the second wet clean tool to the pick-and-place tool immediately after the second wet clean process ends.

4. The integrated semiconductor packaging system of claim 3, wherein the frame is accommodated in a first frame container before the first wet clean process, and the frame is transferred to the pick-and-place tool without being placed in the first frame container after the first wet clean process ends.

5. The integrated semiconductor packaging system of claim 4, wherein the wafer is accommodated in a first wafer container before the second wet clean process, and the wafer is transferred to the pick-and-place tool without being placed in the first wafer container after the second wet clean process ends.

6. The integrated semiconductor packaging system of claim 5, wherein the first wet clean tool and the second wet clean tool are located in a wet clean chamber, and the pick-and-place tool is located in a pick-and-place chamber, and the first transmission path is located between the wet clean chamber and the pick-and-place chamber.

7. The integrated semiconductor packaging system of claim 6, wherein the frame is transferred from the first frame container to the first wet clean tool through a second transmission path.

8. The integrated semiconductor packaging system of claim 7, wherein the wafer is transferred from the first wafer container to the second wet clean tool through a third transmission path.

9. The integrated semiconductor packaging system of claim 8, wherein the wafer is transferred from the pick-and-place tool to a second wafer container through a fourth transmission path, and the frame is transferred from the pick-and-place tool to a second frame container through the fourth transmission path.

10. The integrated semiconductor packaging system of claim 9, wherein current values of a first environmental parameter at the wet clean chamber, the pick-and-place chamber, the first transmission path, the second transmission path, the third transmission path, and the fourth transmission path are controlled.

11. The integrated semiconductor packaging system of claim 10, wherein the first environmental parameter is one of:
    a temperature;
    a humidity;
    an air flow;
    an air pressure; and
    a particle concentration.

12. The integrated semiconductor packaging system of claim 1, wherein the first wet clean tool and the second wet clean tool are located in close proximity to the pick-and-place tool.

13. A method of semiconductor device packaging, comprising:
    wetting a plurality of top dies disposed on a frame in a first wet clean tool located in a wet clean chamber;
    wetting a plurality of bottom dies disposed on a wafer in a second wet clean tool located in the wet clean chamber, the plurality of bottom dies corresponding to the plurality of top dies, respectively;
    transferring the frame to a pick-and-place tool located in a pick-and-place chamber, without placing the frame in a frame container;
    transferring the wafer to the pick-and-place tool, without placing the wafer in a wafer container; and
    bonding, by the pick-and-place tool, the plurality of top dies to the plurality of bottom dies, respectively.

14. The method of claim 13, wherein the frame is transferred from the first wet clean tool to the pick-and-place tool immediately after the plurality of top dies disposed on the frame are wetted.

15. The method of claim 14, wherein the wafer is transferred from the second wet clean tool to the pick-and-place tool immediately after the plurality of bottom dies disposed on the wafer are wetted.

16. The method of claim 13, wherein the wet clean chamber is located in close proximity to the pick-and-place chamber.

17. The method of claim 13, further comprising:
    transferring the wafer from the pick-and-place tool to a second wafer container; and
    transferring the frame from the pick-and-place tool to a second frame container.

18. An integrated semiconductor packaging system comprising:
- a first wet clean tool configured to perform a first wet clean process on a top wafer, wherein a plurality of top dies are disposed on the top wafer;
- a second wet clean tool configured to perform a second wet clean process on a bottom wafer, wherein a plurality of bottom dies corresponding to the plurality of top dies, respectively, are disposed on the bottom wafer;
- a wafer-to-wafer bonding tool configured to bond the top wafer to the bottom wafer, the plurality of top dies being bonded to the plurality of bottom dies, respectively; and
- a first transmission path through which the top wafer and the bottom wafer are transferred from the first wet clean tool and the second wet clean tool to the wafer-to-wafer bonding tool, respectively, wherein the top wafer is directly transferred from the first wet clean tool to the wafer-to-wafer bonding tool, and the bottom wafer is directly transferred from the second wet clean tool to the wafer-to-wafer bonding tool.

19. The integrated semiconductor packaging system of claim 18, wherein the top wafer is transferred from the first wet clean tool to the wafer-to-wafer bonding tool immediately after the first wet clean process ends, and wherein the bottom wafer is transferred from the second wet clean tool to the wafer-to-wafer bonding tool immediately after the second wet clean process ends.

20. The integrated semiconductor packaging system of claim 18, wherein the first wet clean tool and the second wet clean tool are located in close proximity to the wafer-to-wafer bonding tool.

* * * * *